TRANSISTOR AMPLIFIER CIRCUITS FOR SQUARE WAVES, WITH LEVEL SETTING AND NOISE ELIMINATION

Filed Dec. 30, 1957

INVENTOR.
WAYNE W. CHOU
BY Lester W. Clark
ATTORNEY

United States Patent Office 3,064,141 Patented Nov. 13, 1962

3,064,141

TRANSISTOR AMPLIFIER CIRCUITS FOR SQUARE WAVES, WITH LEVEL SETTING AND NOISE ELIMINATION

Wayne W. Chou, Stamford, Conn., assignor to International Business Machines Corporation, New York, N.Y., a corporation of New York Filed Dec. 30, 1957, Ser. No. 706,041
9 Claims. (Cl. 307—88.5)

This invention relates to amplifier circuits, and in particular to amplifier circuits for use with square waves.

The amplifier circuits disclosed herein are suitable for use either as level setters, to correct situations where the input signal level has dropped below a desired value, or to correct situations where the input signal has acquired an excessive noise component.

In modern electronic computers, signals are required to pass through large numbers of stages in sequence. During passage through a considerable number of such stages, the signals may deteriorate in quality, either as to amplitude or shape, or because of the presence of undesirable noise frequency components. The circuits of the present invention are intended to accept an input wave which has so deteriorated and restore it to its desired level, with elimination of any noise frequency component which may be present.

Transistor amplifiers for square wave signals are commonly operated between two stable conditions, termed an OFF or low current condition and an ON or high current condition. It has been common to utilize the saturation condition of the transistor for the ON condition of operation, since a transistor is then very stable.

The use of the saturation condition slows down the response of a transistor, since it results in the storage of minority current carriers in the transistor body, which must be cleared away before the transistor can be completely switched OFF. This clearing of the stored carriers requires a substantial time, e.g., a few microseconds, which is of importance in circuits of this type. The use of a transistor in a saturated condition consequently adversely affects the speed of response of the transistor, and also adversely affects the output wave form.

An object of the present invention is to provide an improved transistor amplifier.

Another object is to provide an improved signal level setter employing a transistor amplifier.

A further object is to provide a transistor amplifier which eliminates noise frequency components from the signals passing through.

Another object is to provide a non-saturating transistor amplifier.

Another object is to provide a transistor amplifier of the type described having low power dissipation.

The foregoing and other objects of the invention are attained in the circuits described herein. In a circuit constructed in accordance with the present invention two stages are typically used. The first stage is constructed to turn ON or OFF in accordance with the polarity of the input signal potential with respect to a fixed datum potential. The first stage output is limited in its potential swing to values on opposite sides of another datum potential. The output signal from the first stage is utilized to drive a second stage whose output is doubly clamped at maximum and minimum values corresponding to the desired output signals. In both stages, the variation of the output potential and current is limited to keep the transistor in a linear region of operation, outside their respective saturation regions. Furthermore, the current flow in the ON condition is limited by an external resistor, to keep the transistor out of the non-linear "alpha-crowding" region.

Other objects and advantages of the invention will become apparent from a consideration of the following specification and claims, taken together with the accompanying drawing.

FIG. 1

Figure 1:
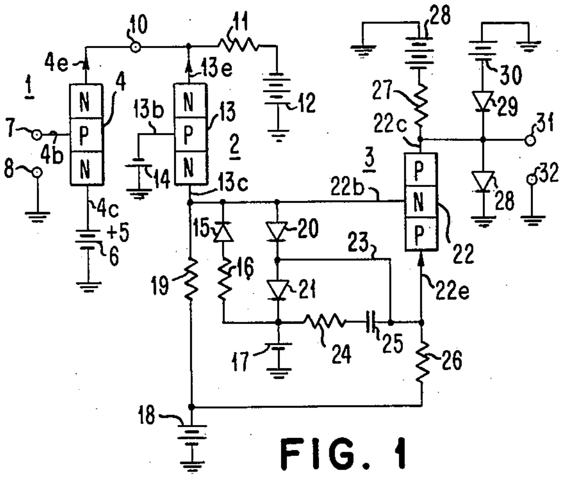
FIG. 1 is a wiring diagram of one form of transistor amplifier embodying the invention.

This figure illustrates a circuit including a driving stage 1, a clipping stage 2, and an amplifying stage 3.

The driving stage 1 comprises an NPN junction transistor 4 having emitter electrode **4*e*, a base electrode 4*b* and a collector electrode 4*c*. The transistor 4 is connected in an emitter follower circuit, constructed according to the principles described in the co-pending application of George D. Bruce et al., Serial No. 459,382, filed September 30, 1954, now United States Patent No. 2,888,-578, issued May 26, 1959. Collector 4*c* is connected through a battery 6 to ground. Base electrode 4*b* is connected through a pair of input terminals 7 and 8 to ground. Emitter 4*e* is connected to a terminal 10, which serves as the input terminal of the clipping stage 2, and thence through a resistor 11 and a battery 12** to ground.

The clipping stage 2 comprises an NPN junction transistor 13 having an emitter electrode **13*e*, a base electrode 13*b* and a collector electrode 13*c*. The emitter electrode 13*e* is connected to the terminal 10. Base electrode 13*b* is connected to the negative terminal of a battery 14, whose positive terminal is connected to ground. Battery 14** may, for example, have a potential of 5 volts.

Collector **13*c* is connected through a diode 15 and a resistor 16 to the positive terminal of a battery 17 whose negative terminal is connected to ground. The diode 15, resistor 16 and battery 17 comprise the principal load circuit of the transistor 13. A constant current supply source, consisting of a battery 18 and a high impedance resistor 19, is also connected to the collector 13*c*, and at times acts as an additional load circuit. A pair of diodes 20 and 21 are connected in series with each other and in parallel to the diode 15 and resistor 16. The diodes 20 and 21 are poled oppositely to the diode 15**.

The amplifier stage 3 takes its input signal from the terminals of the diode 20. The stage 3 comprises a PNP junction transistor 22 having emitter electrode **22*e*, a base electrode 22*b* and a collector electrode 22*c*. Base electrode 22*b* is connected to the anode of diode 20. Emitter 22*e* is connected through a wire 23 to the cathode of diode 20. Diode 21 is shunted by a branch circuit including a resistor 24 and a capacitor 25**.

Emitter **22*e* is also connected to a constant current supply source consisting of the battery 18 and a high impedance resistor 26**.

Collector **22*c* is connected through a principal load resistor 27 and a load supply battery 28 to ground. Collector 22*c* is connected through a clamping diode 28 to ground and through another clamping diode 29 and a biasing battery 30 to ground. Collector 22*c* is also connected to an output terminal 31. An oppostie output terminal 32** is grounded.

*Operation of FIG. 1*

In the following description, certain values of potential and impedance will be assumed for the purpose of making the operation clear. However, it should be understood that the invention is not limited to any of these particular values.

The input signal received at the terminals 7 and 8 is assumed to shift between a nominal OFF value of −10 volts and a nominal ON value of 0 volts. This signal may be deteriorated from its nominal values so that it appears, for example, to shift between −2 volts and −8 volts. Furthermore, it may have a substantial noise frequency component, as explained in detail hereinafter.

The battery 12 and resistor 11 serve as a substantially constant current source which supplies current either to the emitter **13*e* of the clipping stage or to the emitter 4*e* of the driving stage. The base 13*b* is held at −5 volts by the battery 14. The potential of emitter 13*e* cannot swing considerably below the base potential, its minimum value being not more than 0.3 volt below the base potential. In other words, the negative swing of emitter 13*e* with respect to base 13*b*** is limited by the potential drop across the base-emitter impedance in its forward or low impedance direction.

When the input signal appearing between terminals 7 and 8 is at its OFF value of −10 volts, base **4*b* is held at −10 volts and the emitter 4*e* is then approximately at −5 volts, since it is tied to the emitter 13*e*. The emitter-base impedance of transistor 4 is thereby reversely biasd, since the emitter is more positive than the base. Transistor 4 is therefore cut off and substantially no current flows through it. Almost all the current supplied through battery 12 and resistor 11 now passes through emitter 13*e* and transistor 13. The emitter 13*e* is slightly more negative (by about 0.3 volt) than the base 13*b*, so that the emitter-base impedance is forwardly biased and the transistor 13** is ON.

The principal load current of transistor 13 is supplied by battery 17 and flows through resistor 16, diode 15, and collector **13*c*. The resistor 16 has a very low impedance, so that the potential of collector 13*c* is not much less than 5 volts, for example, being about 4.5 volts. Additional load current for transistor 13 is supplied by battery 18 through resistor 19, but that current is relatively small due to the high impedance (4300 ohms) of resistor 19**.

Now consider the conditions in the driving stage 1 and clipping stage 2 when the input signal is at its ON value of 0 volts, i.e. base **4*b* goes to ground potential. Base 4*b* is thereby made positive with respect to emitter 4*e*, which is held in the region of −5 volts by battery 14 and the clamping action of the asymmetric base-emitter impedance of transistor 13. The base-emitter impedance of transistor 4 is now forwardly biased, and that transistor conducts substantial current, taking almost all the current supplied by the battery 12 and resistor 11. This current flow swings the emitter 13*e* more positive than the base 13*b*, reversely biasing the base-emitter impedance of transistor 13**, and cutting that transistor off.

A current now flows from battery 18 through resistor 19, diodes 20 and 21 to battery 17. Also, current flows from battery 18 through resistor 26 and diode 21 to battery 17. The voltage drop across diodes 20 and 21 due to these currents is effective to bias reversely the diode 15, and the current flow through it is cut off.

Although the operation of the drive stage 1 and clipping stage 2 have been described with reference to an input signal shifting between nominal signal values of 0 and −10 volts, it should be observed that the response of these two stages is the same even through the input signal at terminals 7 and 8 may be substantially deteriorated from those values, and may have a substantial noise frequency component. The stages 1 and 2 respond to any input signal more negative than the datum potential established by battery 14, to turn the transistor 13 ON. These stages conversely respond to an input signal more positive than the datum potential established by battery 14 to turn the transistor 13 OFF. Furthermore, the output potential from stage 2, as applied to the amplifier stage 3 is the difference between the forward drop across the diode 20, during the OFF condition of transistor 13, which is in the neighborhood of ½ volt, and the reverse potential across that diode during the ON condition of transistor 13, which is of the same order of magnitude. Consequently, the amplifier stage 3 receives square wave input signals having a difference of about one volt between the ON and OFF values. It may be seen that the input signal to stage 3 is limited to excursions of about ½ volt on either side of a second datum potential determined by the circuit parameters.

Since the driving stage 1 and the clipping stage 2 are directly conductively coupled, the D.C. noise level at the input must be great enough to penetrate the active region of the signal potential, i.e., the range of potentials which is effective to switch the stage 2, in order to appear at the output of that stage. In other words, since the conductive condition of the output of stage 2 is stably determined by the swing of its emitter potential with reference to the base potential of −5 volts, then, in order for a noise signal to appear in the output of stage 2, it must, in either the ON or OFF condition of the input signal, be large enough to swing the base **4*b*** almost 5 volts away from its nominal 0 or −10 volt value. Consequently the D.C. noise level must be almost 5 volts in order to appear in the output of stage 2.

Note that the D.C. noise level is the only criterion for determining whether the noise will penetrate. Other factors, such as the peak-to-peak noise variation, which are important in amplifiers using other types of coupling, e.g., capacitive coupling, are of no importance here.

Considering now the amplifier stage 3, note that resistor 26 and battery 18 form a constant current supply which delivers current either through emitter **22*e* of transistor 22, when that transistor is ON, or through wire 23 and diode 21 to the positive terminal of battery 17, when the transistor 22** is OFF.

Consider first the stable conditions when transistors 13 and 22 are both OFF. The current flow from battery 18 through resistor 19 then proceeds through diodes 20 and 21 to battery 17. The potential drop across the diode 20 produced by that current reversely biases the base-emitter impedance of transistor 22, and holds it OFF. The current flow through resistor 26 then passes through wire 23 and diode 21. The capacitor 25 is charged with its right-hand terminal positive. The collector **22*c* tends to swing toward the potential of the negative terminal of battery 28 (−30 volts), but the swing is limited by the clamping action of diode 29 and battery 30**, which hold the potential at −10 volts.

When transistor 13 is ON, the potential drop across resistor 16 and diode 15 reversely biases the diodes 20 and 21. The difference between the potential drop across resistor 16 and diode 15 on the one hand, and the potential drop between emitter **22*e* and base 22*b* on the other hand, should be great enough to bias reversely the diode 21, so that all the current flowing from battery 18 to the resistor 26 will pass through emitter 22*e* and not through diode 21. Under these conditions, the capacitor 25** is charged with its right-hand terminal negative.

When the transistor 22 is ON, the potential of its collector **22*c* is prevented from rising above ground by the diode 28, so that collector 22*c* is clamped at ground when transistor 22** is ON.

The output signal at terminals 31 and 32 therefore swings between an ON value of 0 volts and an OFF value of −10 volts.

Note, however, that even though the collector of transistor 22 is clamped, the current through it is limited by the constant current source connected to its emitter. A similar action takes place in the transistor 13, so that the power dissipation in each transistor is limited to any desired value determined by the circuit parameters.

The capacitor 25 is effective to speed up the transient response of transistor 22 when it switches from OFF to ON and vice versa. The resistor 24 is effective to prevent overshoot of the potential at the emitter 22e.

Figure 5:
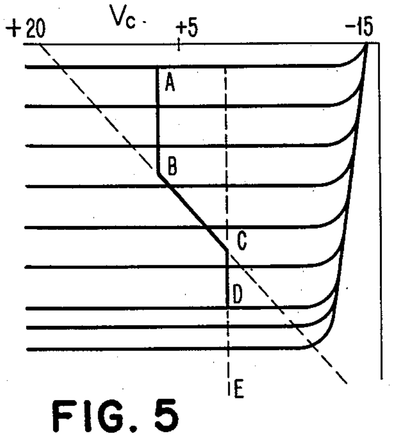
FIG. 5 is a graphical illustration showing the operation of the first stage transistor in one of the circuits described.

FIG. 5 illustrates graphically the operation of the clipping stage 2. The point A represents the OFF condition of the transistor 13. The transistor is then cut OFF, its collector potential is slightly more positive than 5 volts, and its collector current is very low. When the transistor turns ON, it moves along the solid line of ABCD of FIG. 5. The movement of the transistor along the portion CD of this line is limited by the current limiting action of the resistor 11, which establishes the maximum collector current value. By the proper selection of resistor 11, the transistor may be prevented from moving into the high collector current regions, where the non-linear condition known as alpha-crowding may occur.

Figure 6:
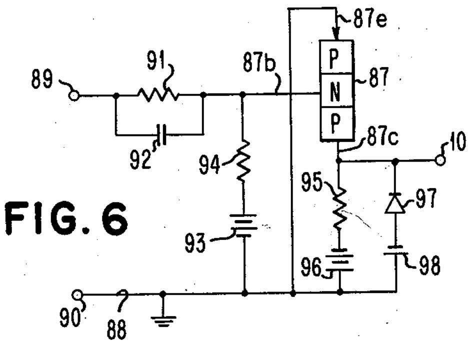
FIG. 6 is a wiring diagram of an inverter circuit which may be used to drive an amplifier constructed in accordance with the invention.

The driving stage in the circuit of FIG. 1 may be replaced by any equivalent circuit, for example, a PNP inverter circuit of the type shown and described in the co-pending application of George D. Bruce et al., Serial No. 459,322, filed September 30, 1954, now Patent No. 2,891,172, granted June 16, 1959 and as shown in FIG. 6, described below.

Since the transistor 13 and transistor 22 are never operated in their saturation regions, there is never any storage of minority carriers in the base region. Such stored carries tend to slow the subsequent switching of the transistor until they are cleared away. The absence of such stored carriers makes the present circuit substantially faster in switching than the prior art circuits.

The limitation of the potential swing at the output of the first stage reduces the effect of stray capacitive loading of the collector 13c. When the transistor 13 switches OFF, this stray capacitance tends to charge along a potential curve varying with time and rising asymptotically toward the potential of battery 18. However, since the final potential of collector 13c is limited, by diodes 20 and 21 and battery 17, to a value which is only a small fraction of that asymptotic potential, the time required to charge to that potential is very short, since the charging takes place on the steep initial portion of the curve. In other words, the stray capacitance charges quickly, because of the low voltage through which its charge is changed.

When the transistor 13 switches ON, the charging current for the stray capacitance must flow through the constant current source, so that that charging current is minimized. The charging rate is very low and nearly linear.

The use of capacitor 25 allows the circuit to be used to drive a capacitive load, with proper balance of impedances for efficient operation.

FIG. 2

Figure 2:
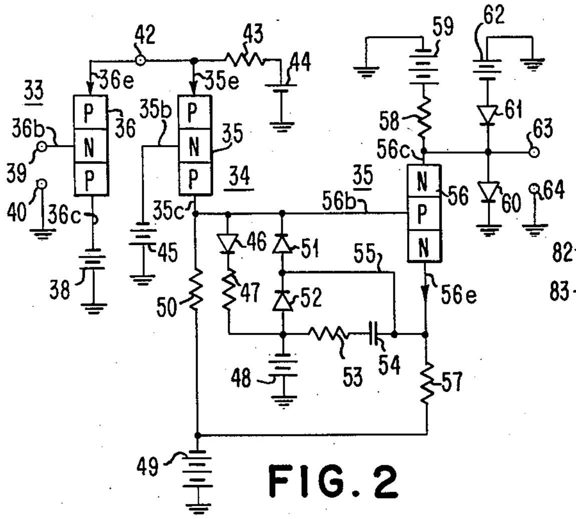
FIG. 2 is a wiring diagram of a modified form of a transistor amplifier embodying the invention.

The circuit of FIG. 2 is similar to that of FIG. 1, except that PNP transistors are used in place of the NPN transistors of FIG. 1, and an NPN transistor is used in FIG. 2 in place of the PNP transistor of FIG. 1. Certain corresponding changes have been made in some of the battery potentials and in some of the impedance values.

The circuit of FIG. 2 includes a driving stage 33, a clipping stage 34 and an amplifying stage 35.

The driving stage 33 comprises a PNP junction transistor 36 having emitter electrode 36e, a base electrode 36b, and a collector electrode 36c. The collector electrode 36c is connected through a battery 38 to ground. Base electrode 36b is connected through input terminals 39 and 40 to ground. Emitter electrode 36e is connected to a terminal 42 and then thence to the clipping stage 34.

The clipping stage 34 includes a PNP transistor 35 having an emitter electrode 35e, a base electrode 35b, and collector electrode 35c. The emitter electrode 35e is connected through a high impedance resistor 43 and a battery 44 to ground. Battery 44 and resistor 43 provide a substantially constant current source similar to the battery 12 and resistor 11 of FIG. 1.

Base electrode 35b is connected through a battery 45 to ground. Collector 35c is connected through a diode 46 and a resistor 47 to the negative terminal of a battery 48, whose positive terminal is grounded. Another constant current drain including a battery 49 and resistor 50 is connected to collector 35c. Two diodes 51 and 52 are connected in series, and the series group is connected in parallel with diode 46 and resistor 47. The polarity of diodes 51 and 52 is opposite to that of diode 46. A resistor 53 and a capacitor 54 are connected in series and across the terminals of diode 52.

The amplifier stage 35 includes a transistor 56 having a collector electrode 56c, a base electrode 56b and an emitter electrode 56e. Emitter electrode 56e is connected to a wire 55 and thence to the common terminal of diodes 51 and 52. Base 56b is connected to the cathode of diode 51. Emitter 56e is connected through a high impedance resistor 57 to battery 49, the resistor 57 and battery 49 together forming a constant current drain. Collector 56c is connected through a resistor 58 and a battery 59 to ground. Collector 56c is also connected through a clamping diode 60 to ground, and through a clamping diode 61 and a biasing battery 62 to ground. Collector 56c is also connected to an output terminal 63, and a cooperating output terminal 64 is grounded.

The operation of FIG. 2 is analogous to that of FIG. 1, and further explanation of it is considered to be unnecessary.

FIG. 3

Figure 3:
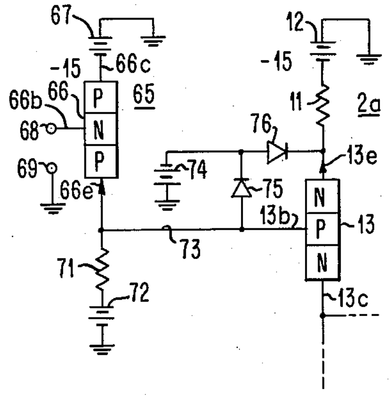
FIG. 3 is a fragmentary wiring diagram illustrating a modification of the circuit of FIG. 1.

The circuits of FIGS. 1 and 2 are inverting circuits. That is to say, when the input signal is at its most positive value, the output signal is at its most negative value, and vice versa. While such an arrangement is satisfactory for many purposes, there are some situations where a non-inverting circuit is required. FIG. 3 shows how a circuit of FIG. 1 may be modified to be non-inverting. In FIG. 3, those elements which are the same structure and function as their counterparts in FIG. 1 have been given the same reference numerals and will not be further described.

The clipping stage 2a of FIG. 3 is modified as compared to the clipping stage 2 of FIG. 1, in that the latter is a grounded base amplifier stage, whereas the stage 2a is an inverter stage. The input signals are applied to the emitter 13e in the stage 2 of FIG. 1, whereas the input signals are applied to the base 13b in the inverter stage 2a of FIG. 3.

This change in the stage 2a requires a different driving stage 65, which is a PNP emitter follower stage as compared to the NPN emitter follower stage of FIG. 1.

The driving stage 65 includes a PNP transistor 66 having a collector electrode 66c, a base electrode 66b and an emitter electrode 66e. Collector 66c is connected through a biasing battery 67 to ground. Base electrode 66b is connected through input terminals 68 and 69 to ground. Emitter electrode 66e is connected through a resistor 71 and a battery 72 to ground. Emitter electrode 66e is also connected through a wire 73 to base electrode 13b. A biasing battery 74 is connected through a diode 75 to the base electrode 13b, and through another diode 76 to the emitter electrode 13e.

*Operation of FIG. 3*

When the input signal potential at the terminal 68 is more positive than the potential of biasing battery 74, then transistor 66 is cut off, since emitter 66e is clamped at the potential of battery 74 by diode 75. The potential drop across diode 75 is sufficient to bias reversely the diode 76 and to bias forwardly the base-emitter impedance of the transistor 13. The transistor 13 is therefore ON. As in FIG. 1, when the transistor 13 is ON, the transistor 22 is ON and the output signal at 31, 32 is at its most positive value.

When the input signal at terminal 68 is less than the potential of biasing battery 74, the emitter 66e is more positive than the base 66b, and transistor 66 is ON. There is then a substantial potential drop across resistor 71, and wire 73 is more negative than the negative terminal of battery 74. Current then flows from battery 74 through diode 76 and the resistor 11, thus starving current from the emitter-base impedance of transistor 13, turning that transistor OFF. The diode 75 is now reversely biased, and therefore conducts no current. Since the transistor 13 is OFF, transistor 22 is OFF, and the output signal potential is at its most negative value. It may therefore be seen that the circuit of FIG. 3 is non-inverting in that the most positive input signal corresponds to the most positive output signal and the most negative input signal produces the most negative output signal.

FIG. 4

Figure 4:
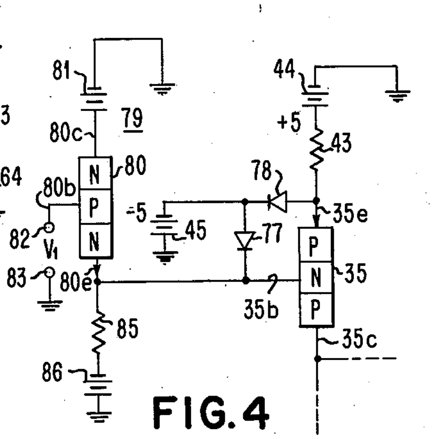
FIG. 4 is another fragmentary wiring diagram illustrating a similar modification of the circuit of FIG. 2.

This circuit illustrates how the circuit of FIG. 2 may be modified to make it non-inverting. The changes in the circuit of FIG. 2 to produce the circuit of FIG. 4 are similar to the changes made in the circuit of FIG. 1 to produce the non-inverting circuit of FIG. 3. Those elements of FIG. 4 which are the same as their counterparts in FIG. 2 have been given the same reference numerals and will not be further described.

In FIG. 4, biasing battery 45 is connected to base electrode 35b by means of a diode 77, and to emitter electrode 35e through a diode 78.

The PNP emitter follower stage 33 of FIG. 2 is replaced in FIG. 4 by an NPN emitter follower stage generally indicated at 79. The stage 79 includes a transistor 80 having a collector electrode 80c, a base electrode 80b, and an emitter electrode 80e. Collector electrode 80c is connected through a battery 81 to ground. Base electrode 80b is connected to input terminal 82, and input terminal 83 is connected to ground. Emitter electrode 80e is connected through a resistor 85 and a battery 86 to ground.

The operation of FIG. 4 is entirely analogous to that of FIGS. 1, 2 and 3 and further description is considered unnecessary.

FIG. 6

FIG. 6 illustrates an inverter stage which may be used in place of the driving stage 1 of FIG. 1. This inverter stage includes a PNP junction transistor 87, having an emitter electrode 87e, a base electrode 87b, and a collector electrode 87c. Emitter 87e is connected to a grounded wire 88. The input signal is applied through a pair of input terminals 89 and 90. Input terminal 89 is connected through a resistor 91 and a parallel capacitor 92 to the base electrode 87b. Input terminal 90 is connected to grounded wire 88.

Means for biasing the base electrode 87b positively is provided, including a battery 93 and a resistor 94 connected in series between grounded wire 88 and base 87b. Collector 87c is connected to a load circuit including a load resistor 95 and a battery 96 in series, the opposite terminal of battery 96 being connected to grounded wire 88.

A clamping circuit is provided for limiting the minimum negative potential of collector 87c. This clamping circuit comprises a diode 97 and a battery 98 connected in series between collector electrode 87c and grounded wire 88.

Output terminal 10 is connected to collector 87c and corresponds to terminal 10 of FIG. 1.

*Operation of FIG. 6*

When the incoming signal is at its negative value, the base electrode 87b is maintained thereby at a negative potential overcoming the effect of biasing battery 93.

The emitter electrode 87e is connected to ground, and is therefore continuously at a potential of 0 volts. The emitter is then positive with respect to the base 87b, and the transistor 87 is conductive, so that a substantial current flows in the load circuit of the transistor. The potential of the collector electrode is below ground only by the potential drop through the transistor, which at this time is very small, so that the collector electrode is at a negative potential of a few tenths of a volt, which may be for practical purposes considered as 0 volts. A substantial current also flows through the base electrode 87b producing a potential drop across resistor 91, which potential drop is effective to charge the capacitor 92 with its right-hand terminal positive. This potential drop across resistor 91 must be less than 10 volts, since base 87b is to be held negative.

Now assume that the incoming signal shifts to its positive value. When this positive wave is first impressed across terminals 89 and 90, it adds in series with the potential due to the charge on capacitor 92. The potential at the base 87b is therefore suddenly increased, and the base swings positive. The high positive potential applied to base 87b swings it above the potential of the emitter 87e, thereby cutting off the flow of current in the transistor 87. The charge across the capacitor 92 leaks off through resistor 91, the potential of base 87b falling substantially to the potential of input terminal 89. When the current flow in transistor 87 cuts off, the collector electrode 87c then swings negatively, tending to assume the potential of the negative terminal of battery 96. The negative swing of collector 87c is, however, limited by the clamping diode 97 and the battery 98.

It may therefore be seen that the circuit of FIG. 1 inverts signals supplied at the terminals 89 and 90, reversing the polarity of the potentials of the input signals.

The following table shows, by way of example, values of battery potentials, and resistor and capacitor values, which have been used in circuits successfully operated in accordance with the invention. It should be clearly understood, however, that these are examples only, and that the invention is not limited to them, or any of them.

FIG. 1

| | | |
|---|---|---|
| Battery 6 | volts | 5 |
| Battery 9 | do | 10 |
| Resistor 11 | ohms | 1200 |
| Battery 12 | volts | 15 |
| Battery 14 | do | 5 |
| Resistor 16 | ohms | 180 |
| Battery 17 | volts | 5 |
| Battery 18 | do | 20 |
| Resistor 19 | ohms | 4300 |
| Resistor 24 | do | 130 |
| Capacitor 25 | mfd | 0.01 |
| Resistor 26 | ohms | 1100 |
| Resistor 27 | do | 3300 |
| Battery 28 | volts | 30 |
| Battery 30 | do | 10 |

FIG. 2

| | | |
|---|---|---|
| Battery 38 | volts | 15 |
| Battery 41 | do | 10 |
| Resistor 43 | ohms | 1200 |
| Battery 44 | volts | 5 |
| Battery 45 | do | 5 |
| Resistor 47 | ohms | 180 |
| Battery 48 | volts | 15 |
| Battery 49 | do | 30 |
| Resistor 50 | ohms | 4300 |
| Resistor 53 | do | 30 |
| Capacitor 50 | mfd | 0.01 |
| Resistor 57 | ohms | 1100 |
| Resistor 58 | do | 3300 |
| Battery 59 | volts | 20 |
| Battery 62 | do | 10 |

FIG. 3

| | | |
|---|---|---|
| Battery 67 | volts | 15 |
| Battery 70 | do | 10 |
| Resistor 71 | ohms | 3300 |
| Battery 72 | volts | 20 |
| Battery 74 | do | 5 |

FIG. 4

| | | |
|---|---|---|
| Battery 81 | volts | 5 |
| Battery 84 | do | 10 |
| Resistor 85 | ohms | 3300 |
| Battery 86 | volts | 30 |

While I have in some instances referred to a constant current source and in others to a constant current drain, it should be recognized that those terms are equivalents, being distinguished only by the direction of current flow, and that equivalent circuits may be constructed wherein the directions of flow are reversed.

While I have shown and described certain preferred embodiments of my invention, other modifications thereof will readily occur to those skilled in the art, and I therefore intend my invention to be limited only to the appended claims.

I claim as my invention:

1. A two-stage amplifier comprising a first stage including a transistor having an input electrode, an output electrode and a common electrode, square wave signal input means connected to said input electrode and shiftable between separated potentials respectively effective to establish said transistor in a relatively low output current OFF state and a relatively high output current ON state, a source of unidirectional electrical energy, a load circuit connected between said output electrode and said source and including in series a first diode and a resistor, said source being poled to bias said output electrode reversely and said diode forwardly, second and third diodes connected in series between said output electrode and said source and poled oppositely to said first diode, a constant current supply means connected to said output electrode, said source being effective to bias said second and third diodes reversely when said transistor is ON, said constant current supply means being effective to bias said second and third diodes forwardly when said transistor is OFF; and a second stage comprising a second transistor having an input electrode, an output electrode and a common electrode, means connecting said input and common electrodes to the terminals of said second diode, second constant current supply means connected to said input electrode of said second transistor, said second transistor being switched ON and OFF in accordance with the direction of the potential across said second diode, load means connected to the output terminal of said second transistor, and double clamp means connected to said last-mentioned output terminal to limit the potential swing thereof in both directions.

2. A two-stage amplifier for square wave signals shiftable between separated signal potentials separated in opposite senses from a first datum potential and subject to superimposed noise frequency signals substantially smaller in amplitude than the separations between said datum potential and said signal potentials, comprising first and second stages connected in cascade, said first stage including a transistor, first double clamp means connected to the transistor output and effective to limit excursions of the output potential from a second datum potential to ranges small as compared to the separation between said input signal potentials and said first datum potential, said double clamp means being effective to obliterate said noise frequency signals, and a second stage including a transistor coupled to the output of the first stage, and second double clamp means connected to said second transistor and effective to limit the output potential thereof to said separated potentials.

3. Interstage coupling means for a transistor amplifier, comprising a first diode, a load resistor, means connecting said diode and resistor in series across the output of a driving stage, second and third diodes connected in a series group, said series group being connected in parallel with said first diode and resistor, the diodes of said second group being poled oppositely to said first diode, said second diode being connected across the input of a driven stage.

4. A non-saturating transistor amplifier comprising a transistor having input, output and common electrodes, means connecting the common electrode to a common junction, means, including square wave signal input means, connecting the input electrode to the common junction, and an output network connected between the output electrode and the common junction, one of said connecting means including a first source of direct current, said signal input means being shiftable between signal and no-signal potentials respectively effective to cause relatively high current conduction and relatively low current conduction in the transistor, said output network comprising a second source of direct current, a first relatively high resistance connected between one terminal of said second source and said output electrode, means connecting the other terminal of the second source to the common junction, said second source being poled to bias the output electrode reversely with respect to the common electrode, a first asymmetrically conductive branch circuit connected between the output electrode and the common junction and poled to conduct current from the second source in its low impedance direction, said first branch circuit being effective to limit the difference between the output electrode potential and the common junction potential in the low current condition of the transistor, and a second asymmetrically conductive branch circuit connected between the output electrode and the common junction and poled oppositely to said first branch circuit, said second branch circuit being effective to limit the difference between the output electrode potential and the common junction potential in the high current condition of the transistor.

5. A non-saturating transistor amplifier as defined in claim 4, in which said first asymmetrically conductive branch circuit comprises two diodes in series and means for taking an output between the output electrode and the common terminal of the two diodes; and said second asymmetrically conductive branch circuit comprises a diode and a resistor in series.

6. A non-saturating transistor amplifier as defined in claim 4, in which said first asymmetrically conductive branch circuit consists of a single diode and means for taking an output across said single diode and said second asymmetrically conductive branch circuit comprises a second diode and a third source of direct current poled in the same sense as said second source with respect to the output electrode.

7. A non-saturating transistor amplifier as defined in claim 4, in which the means connecting the common electrode to the common junction includes said first source of direct current, means connecting one terminal of the first source to the common junction, a second resistance connected between the other terminal of the first source and the common electrode, and a first diode connected between the common electrode and the common junction and poled to present its low impedance to current from the first source, and the means connecting the input electrode to the common junction comprises a second diode having its terminals respectively connected to the input and common electrodes.

8. A non-saturating transistor amplifier as defined in claim 7, in which said second diode is poled oppositely to the internal input-common impedance of the transistor and the diode terminals are connected directly to the input and common electrodes without intervening impedances.

9. A non-saturating transistor amplifier as defined in claim 7, in which said second diode has one of its terminals connected directly to the input electrode and the other of its terminals connected to the common electrode through the first diode, and means fixing the potential of the other diode terminal with respect to the common junction potential.

References Cited in the file of this patent

UNITED STATES PATENTS

| | | |
|---|---|---|
| 2,144,995 | Pulvermacher | Jan. 24, 1939 |
| 2,509,742 | Mynall | May 30, 1950 |
| 2,618,753 | Mierlo | Nov. 18, 1952 |
| 2,644,887 | Wolfe | July 7, 1953 |
| 2,683,806 | Moody | July 13, 1954 |
| 2,712,065 | Elbourn et al. | June 28, 1955 |
| 2,724,061 | Emery | Nov. 15, 1955 |
| 2,772,410 | Logue et al. | Nov. 27, 1956 |
| 2,810,072 | Amatniek | Oct. 15, 1957 |
| 2,828,417 | Fleming | Mar. 25, 1958 |
| 2,853,630 | Lane et al. | Sept. 23, 1958 |
| 2,892,101 | Bright | June 23, 1959 |